(12) United States Patent  
Kuwahara et al.

(10) Patent No.: US 11,418,314 B2
(45) Date of Patent: Aug. 16, 2022

(54) RECEPTION CIRCUIT

(71) Applicant: Mitsubishi Electric Corporation, Tokyo (JP)

(72) Inventors: Takashi Kuwahara, Tokyo (JP); Koji Shibuya, Tokyo (JP); Tetsu Owada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/502,235

(22) Filed: Oct. 15, 2021

(65) Prior Publication Data

US 2022/0038253 A1    Feb. 3, 2022

Related U.S. Application Data

(63) Continuation of application No. PCT/JP2019/020502, filed on May 23, 2019.

(51) Int. Cl.
*H04L 7/00* (2006.01)

(52) U.S. Cl.
CPC .................................. *H04L 7/0087* (2013.01)

(58) Field of Classification Search
CPC ... H04L 7/0087; H04L 25/03; H04L 25/0292; H03K 5/1252
See application file for complete search history.

(56) References Cited

U.S. PATENT DOCUMENTS

| 6,037,824 | A | 3/2000 | Takahashi |
| 6,070,257 | A | 5/2000 | Takahashi |
| 2002/0144199 | A1 | 10/2002 | Takahashi |
| 2005/0028063 | A1 | 2/2005 | Takahashi |
| 2011/0291766 | A1* | 12/2011 | Mashimo ................ H03F 1/083 |
| | | | 330/308 |
| 2017/0195605 | A1* | 7/2017 | Alves ..................... H04N 5/243 |
| 2021/0405095 | A1* | 12/2021 | Hong ....................... H03F 3/087 |

FOREIGN PATENT DOCUMENTS

JP    10-126230 A    5/1998

* cited by examiner

*Primary Examiner* — Dac V Ha
(74) *Attorney, Agent, or Firm* — Birch, Stewart, Kolasch & Birch, LLP

(57) ABSTRACT

On the basis of the peak point of the integrated waveform of the reception signal for each one-bit time, a timing of resetting the integrated value of the reception signal for each one-bit time and a timing of determining whether a voltage of the reception signal for each one-bit time is high or low are indicated.

3 Claims, 9 Drawing Sheets

Waveform of Transmission Signal a    Threshold Voltage Vth

Eye Pattern Display of Waveform of Transmission Signal a

Waveform of Reception Signal b

Eye Pattern Display of Waveform of Reception Signal b

RECEPTION CIRCUIT

CROSS REFERENCE TO RELATED APPLICATIONS

This application is a Continuation of PCT International Application No. PCT/JP2019/020502, filed on May 23, 2019, which is hereby expressly incorporated by reference into the present application.

TECHNICAL FIELD

The present invention relates to a reception circuit.

BACKGROUND ART

For example, a circuit described in Patent Literature 1 includes an integration circuit that integrates a reception signal every one-bit time. In this circuit, the reception signal is integrated every one-bit time by the integration circuit, so that a signal level corresponding to one bit of the reception signal increases in accordance with the integration time. Thus, it is possible to accurately compare a 01 determination threshold for determining whether the signal of one bit irs 0 or 1 (hereinafter, described as "01 determination") with the signal level. Furthermore, since the noise (for example, thermal noise) superimposed on the reception signal is averaged or flattened, the influence of the noise superimposed on the reception signal is reduced as compared with the case of performing 01 determination by comparing the reception signal with the threshold at a constant timing.

CITATION LIST

Patent Literature

Patent Literature 1: Japanese Patent Laid-open Publication No. 10-126230

SUMMARY OF INVENTION

Technical Problem

The circuit described in Patent Literature 1 includes a plurality of reception circuits that operate in synchronization with each of a plurality of clock signals whose phases are shifted from each other. These reception circuits perform 01 determination of the signal every one-bit time at a timing corresponding to the input clock signal. For this reason, the circuit described in Patent Literature 1 requires a plurality of reception circuits for performing 01 determination of a signal for each one-bit time and a plurality of signal lines for inputting clock signals and a 01 determination threshold to these reception circuits, and has a problem that the scale of the entire circuit is increased.

The present invention solves the above problems, and has an object to obtain a reception circuit capable of reducing the circuit scale.

Solution to Problem

A reception circuit according to the present invention includes: processing circuitry configured to integrate a reception signal for each integration time; detect a peak point of an integrated waveform of the reception signal; determine whether a voltage of the reception signal for each integration time is high or low on a basis of the integrated waveform of the reception signal for each integration time; and indicate a resetting timing of an integrated value and a determination timing on a basis of the peak point detected from the integrated waveform of the reception signal, wherein the processing circuitry resets the integrated value of the reception signal for each integration time at the indicated resetting timing, and the processing circuitry performs determination at the indicated determination timing and sequentially outputs a voltage value of the reception signal for each integration time.

Advantageous Effects of Invention

According to the present invention, the timing of resetting the integrated value of the reception signal for each integration time and the timing of determining whether the voltage of the reception signal for each integration time is high or low are indicated by on the basis of the peak point of the integrated waveform of the reception signal. As a result, a timing for performing 01 determination and a timing for resetting the integrated value can be obtained from the reception signal without using the plurality of clock signals, so that a plurality of reception circuits and a plurality of signal lines are unnecessary, and the circuit scale can be reduced.

DESCRIPTION OF EMBODIMENTS

First Embodiment

Figure 1:
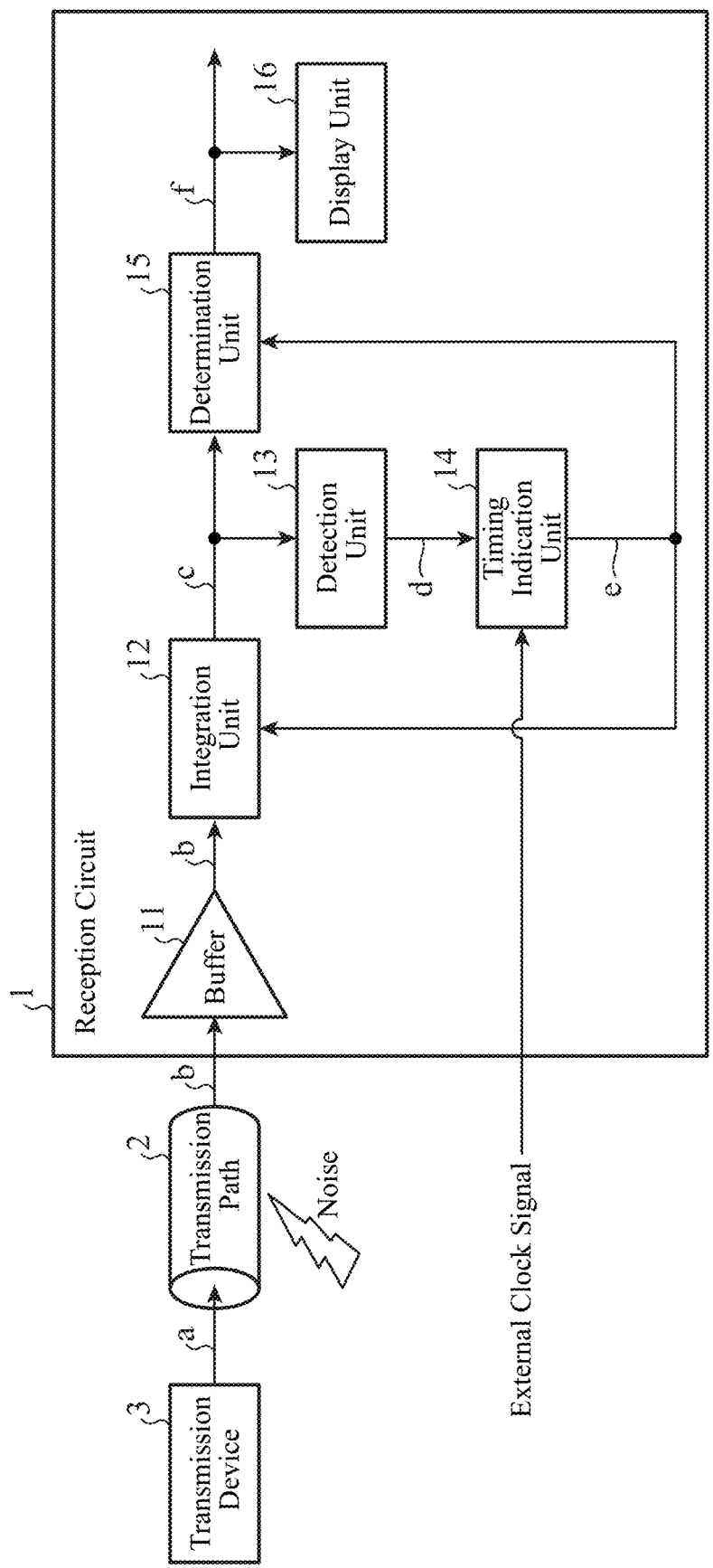
FIG. 1 is a block diagram illustrating a configuration of a communication system including a reception circuit according to a first embodiment.
Figure 2:
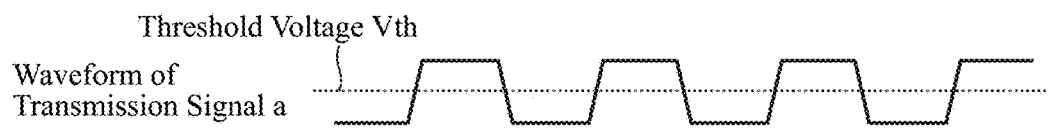
FIG. 2 is a waveform diagram illustrating a waveform of a signal used by the communication system in FIG. 1.
Figure 2:
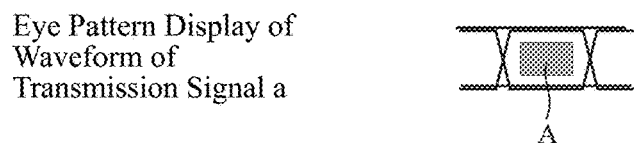
Figure 2:
Figure 2:
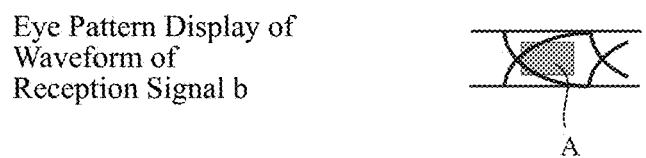
Figure 2:
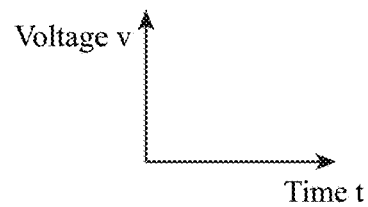

FIG. 1 is a block diagram illustrating a configuration of a communication system including a reception circuit 1 according to a first embodiment. Furthermore, FIG. 2 is a waveform diagram illustrating a waveform of a signal used by the communication system of FIG. 1. In FIG. 2, the horizontal axis represents time t, and the vertical axis represents voltage v. The communication system illustrated in FIG. 1 includes a reception circuit 1, a transmission path 2, and a transmission device 3. A transmission signal a output from the transmission device 3 is, for example, a rectangular wave signal in which high and low voltage levels are alternately repeated as illustrated in FIG. 2. The transmission signal a propagates through the transmission path 2 and then becomes a reception signal b and is received by the reception circuit 1.

The transmission path 2 includes, for example, aboard wiring or a conductive cable. The transmission path 2 has a property similar to a low-pass filter in which the attenuation amount of the transmission signal a increases as the frequency of the transmission signal a increases due to the influence of the conduction loss or the dielectric loss of the transmission signal a. The higher the transmission speed of the transmission signal a or the longer the transmission distance, the greater the attenuation of the transmission signal a in the high frequency region than in the low frequency region. As a result, even in the transmission signal a having a waveform in which the rising and falling edge portions change linearly, the reception signal b has a waveform in which the rising and falling portions are blunted as illustrated in FIG. 2.

When the transmission signal a is attenuated in the transmission path 2, the reception signal b may not rise to a high voltage level within one-bit time, may not fall to a low voltage level, and may not reach the maximum value of the high and low voltage levels of the transmission signal a output from the transmission device 3. For example, one-bit time becomes shorter as the signal transmission rate becomes higher. Therefore, as illustrated in FIG. 2, even in a case where the transmission waveform of the transmission signal a is not included in the eye mask A and the eye mask definition is satisfied, it is likely to occur that the transmission waveform of the reception signal b is included in the eye mask A, and the eye mask definition is not satisfied.

In addition, depending on the waveform pattern of the transmission signal a, the voltage level within one-bit time of the reception signal b does not exceed the 01 determination threshold, and a bit determination error due to inter-symbol interference (ISI) caused by the bit pattern of 01 is likely to occur. As described above, the amount of jitter and the size (height and width) of the eye opening in the eye pattern of the reception signal are used as indices for evaluating the quality of the reception signal. In recent years, since a signal transmission rate is remarkably increased, improvement in quality of a reception signal is required.

As illustrated in FIG. 1, the reception circuit 1 includes a buffer 11, an integration unit 12, a detection unit 13, a timing indication unit 14, a determination unit 15, and a display unit 16. The buffer 11 temporarily stores the reception signal b and then outputs the reception signal b to the integration unit 12. Note that the buffer 11 may be omitted from the reception circuit 1. In FIG. 1, one single-ended signal line is assumed as a signal line for inputting the reception signal b to the buffer 11. However, a signal line corresponding to a differential input and corresponding to a single-ended output may be used.

Figure 3:
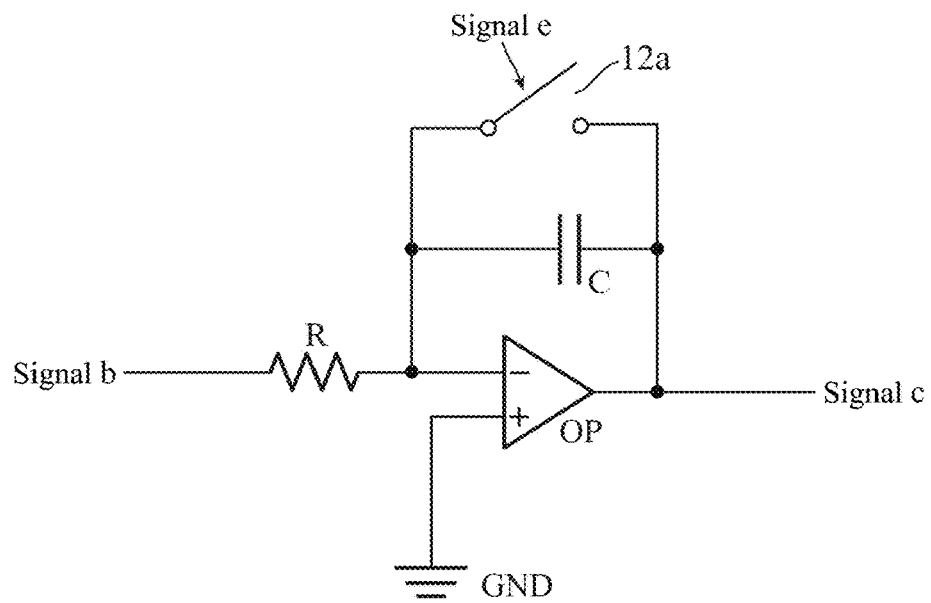
FIG. 3 is a circuit diagram illustrating a mirror integration circuit and a reset switch.

The integration unit 12 integrates the reception signal b for each integration time. Here, the integration time is, for example, one-bit time corresponding to one bit of the transmission signal a. The integration unit 12 integrates the reception signal b input from the buffer 11 every one-bit time, and outputs a signal c for each one-bit time to the detection unit 13 and the determination unit 15. FIG. 3 is a circuit diagram illustrating a mirror integration circuit and a reset switch. The integration unit 12 can be implemented by, for example, a simple circuit in which one capacitor is connected between the signal line and the ground. In addition, it may be an RC circuit or a mirror integration circuit using an operational amplifier OP as illustrated in FIG. 3.

In the mirror integration circuit, a charge is stored in a capacitor C as an integrated value of the reception signal b for each one-bit time. A switch 12a connected in parallel with the capacitor C is a switch for removing the charge stored in the capacitor C. When a reset signal (indication information e) output from the timing indication unit 14 is input to the switch 12a, the switch 12a is closed to short-circuit both ends of the capacitor C, and the integrated value is reset to 0. When the switch 12a is closed, the switch immediately returns to the open state, and remains in the open state until the next reset signal is input from the timing indication unit 14.

The detection unit 13 receives the signal c integrated by the integration unit 12 and detects a peak point of the unevenness of the integrated waveform (the integrated waveform before resetting). The peak point is an uneven portion of the integrated waveform, that is, a position or time at which the tendency of increasing with the lapse of time becomes gentle and starts to change to the tendency of decreasing. A signal d indicating the position or time of the peak point detected by the detection unit 13 is output to the timing indication unit 14.

Figure 4:
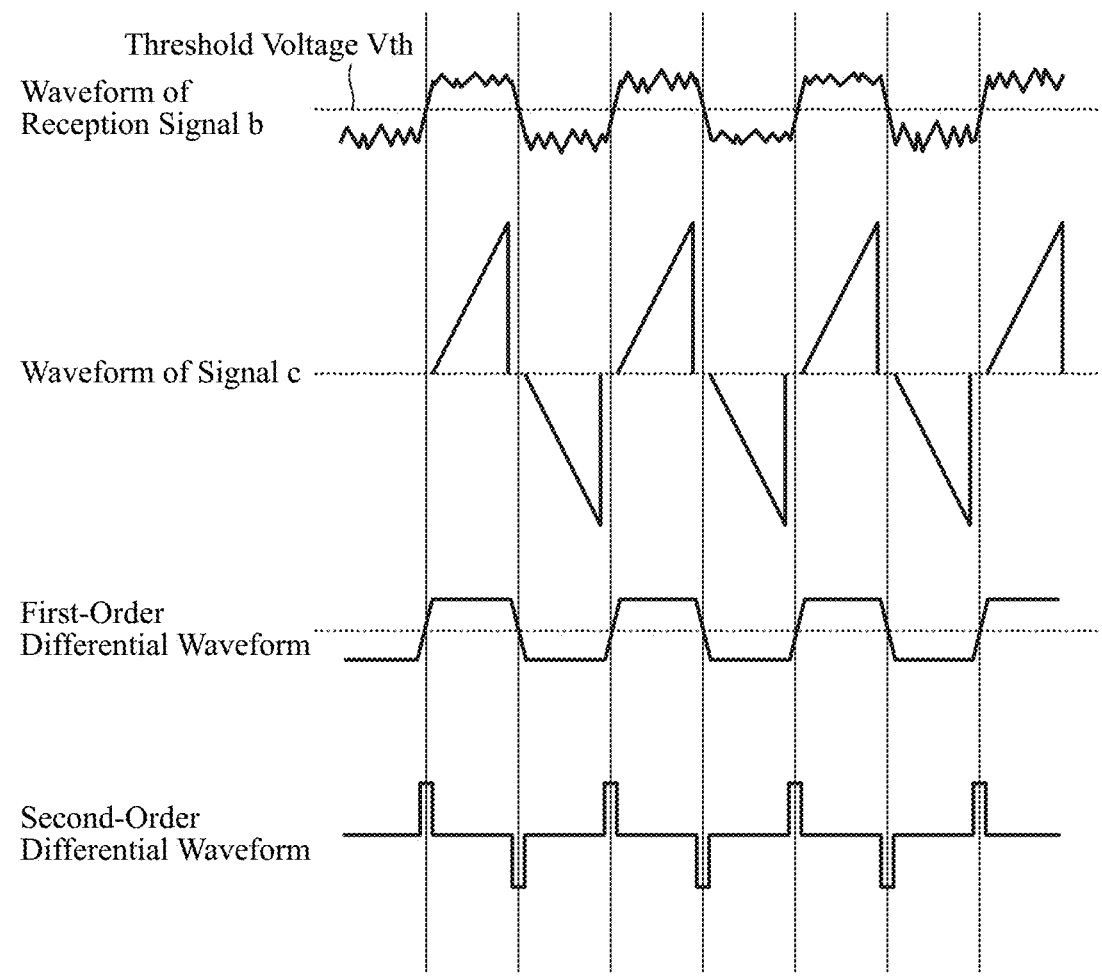
FIG. 4 is a waveform diagram illustrating a waveform of a signal used by the reception circuit according to the first embodiment.
Figure 4:
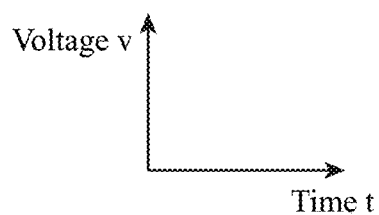

FIG. 4 is a waveform diagram illustrating a waveform of a signal used by the reception circuit 1 according to the first embodiment, and illustrates a waveform of the reception signal b, a waveform of the signal c, a waveform of a signal obtained by first-order differentiating the signal c, and a waveform of a signal obtained by second-order differentiating the signal c. In FIG. 4, the horizontal axis represents time t, and the vertical axis represents voltage v. In the reception signal b, when the signal voltage in one-bit time exceeds a determination threshold Vth, the signal level at this time is determined to be high, and when the signal voltage is less than the determination threshold Vth, the signal level at this time is determined to be low.

The detection unit 13 detects a peak point of the integrated waveform on the basis of a waveform obtained by differentiating (for example, second-order differentiating) the integrated waveform obtained by the integration unit 12 a plurality of times. The waveform of the signal obtained by first-order differentiating the integrated waveform corresponds to the waveform of the reception signal b in which noise is flattened as illustrated in FIG. 4. In addition, the waveform of the signal obtained by second-order differentiating the integrated waveform changes at a timing when the signal level of the reception signal b rises from low to high and changes at a timing when the signal level of the reception signal b falls from high to low. The detection unit 13 outputs a signal obtained by second-order differentiating the integrated waveform to the timing indication unit 14 as a signal d indicating a peak point of the integrated waveform.

Figure 5:
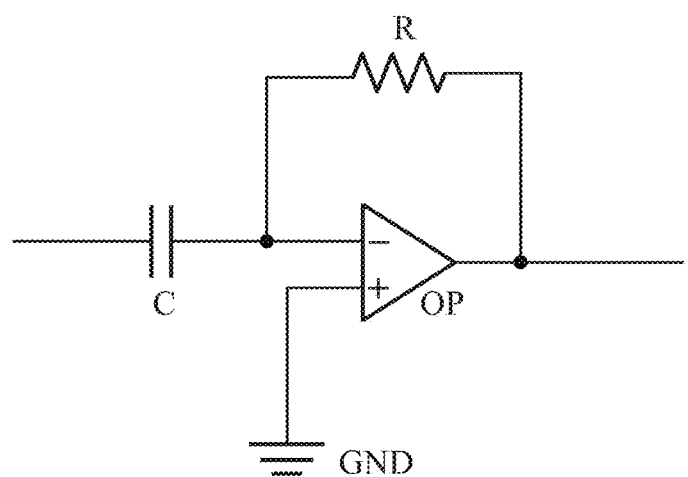
FIG. 5 is a circuit diagram showing a differentiating circuit.

FIG. 5 is a circuit diagram illustrating a differentiating circuit. The detection unit 13 can be implemented by a CR circuit, but may be implemented by a differentiating circuit using an operational amplifier OP as illustrated in FIG. 5. The detection unit 13 that second-order differentiates the signal output from the integration unit 12 can be implemented by a circuit in which two differentiating circuits illustrated in FIG. 5 are connected in series. For example, the determination threshold Vth is a potential of the ground GND.

In the differentiating circuit illustrated in FIG. 5, the signal c is input to the inverting terminal side of the operational amplifier OP, and the non-inverting terminal is at the potential of the ground GND. In the differentiating circuit illustrated in FIG. 5, the direction of the high or low voltage of the signal c is opposite to the direction of the voltage in the waveform of the first-order differentiated signal. Note that, also in the integration circuit illustrated in FIG. 3, the direction of the voltage of the waveform of the reception signal b input to the operational amplifier OP and the direction of the voltage of the waveform of the signal c output from the operational amplifier OP is inverted similarly to the differentiating circuit illustrated in FIG. 5.

On the basis of the peak point detected by the detection unit 13, the timing indication unit 14 indicates the timing at which the integration unit 12 resets the integrated value for each one-bit time, and indicates the timing at which the determination unit 15 makes a determination. For example, the timing indication unit 14 determines that there is a peak point at a timing when there is a value larger than the determination threshold on the plus side and there is a peak point at a timing when there is a value larger than the determination threshold on the minus side in the waveform of the second-order differentiated signal d illustrated in FIG. 4, and outputs indication information e indicating this timing to the integration unit 12 and the determination unit 15. As a result, the integration unit 12 resets the integrated value at the timing indicated by the indication information e, and the determination unit 15 performs determination.

The determination unit 15 determines whether the signal level of the reception signal b for each one-bit time is high or low on the basis of the integrated waveform (integrated waveform before resetting) output from the integration unit 12. In addition, the determination unit 15 performs determination at the timing indicated by the timing indication unit 14 using the indication information e, and outputs a signal level f of the reception signal b determined every one-bit time. The determination result output from the determination unit 15 is displayed by the display unit 16.

Figure 6:
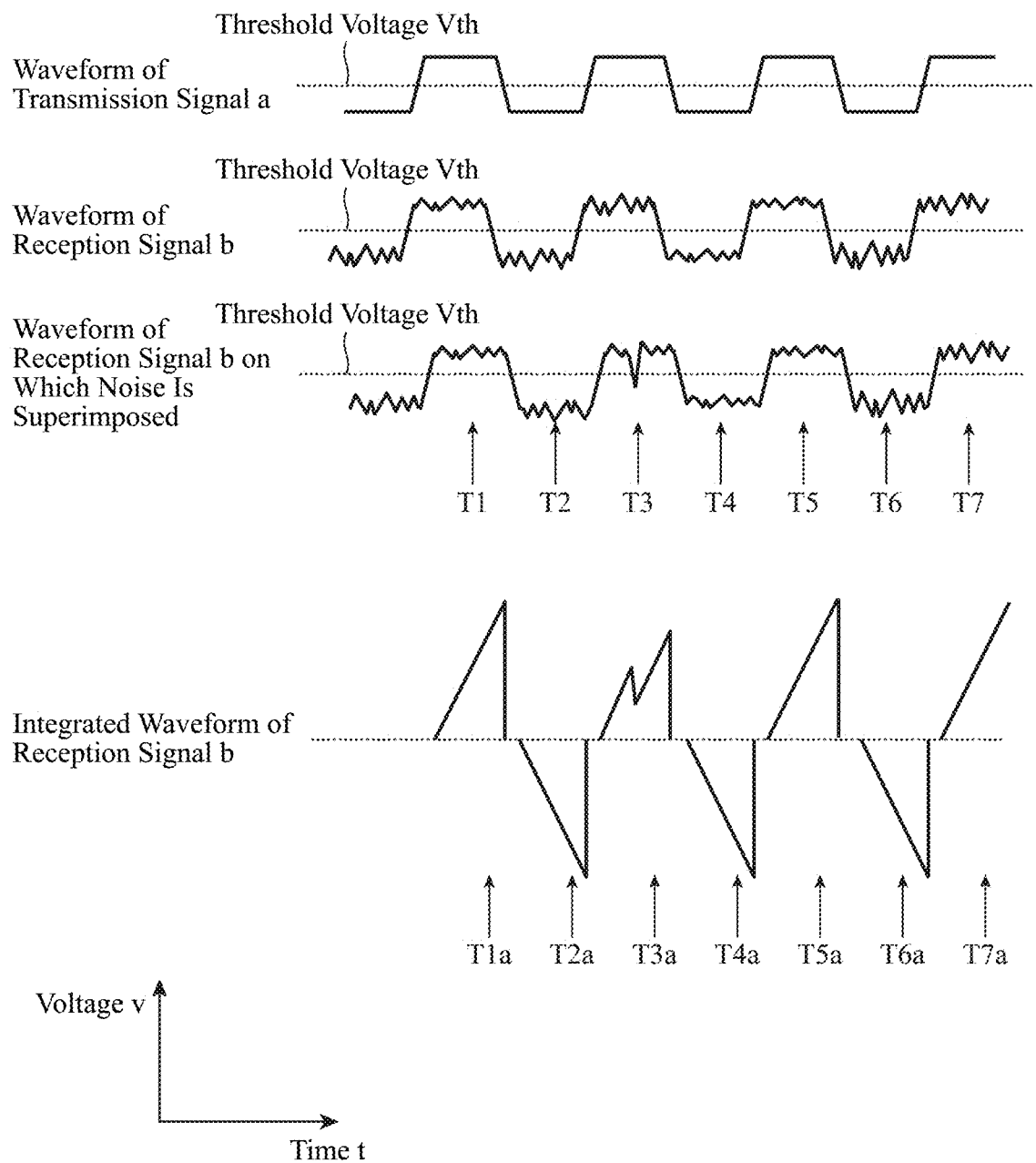
FIG. 6 is an explanatory diagram illustrating a waveform change of a reception signal on which pulsed noise is superimposed.

FIG. 6 is an explanatory diagram illustrating a waveform change of the reception signal on which the pulsed noise is superimposed. The conventional digital reception circuit directly performs the 01 determination on the reception signal having passed through the buffer. In this case, magnitude comparison between the voltage value of the reception signal and the determination threshold Vth is performed at a certain determined timing. In a case where the 01 determination is performed at timings T1 to T7 illustrated in FIG. 6, for example, when the pulsed noise having a large amplitude is superimposed on the reception signal b at the moment of comparison with the determination threshold Vth at the timing T3, the comparison between the voltage value of the reception signal b and the determination threshold Vth cannot be performed normally, and a bit error occurs.

On the other hand, in the reception circuit 1 according to the first embodiment, the signal c obtained by integrating the reception signal b is a target of 01 determination. The voltage of the reception signal b is accumulated by the integration time, and the integrated value unilaterally increases. For example, even if 01 determination is performed at timings T1a to T7a illustrated in FIG. 6 and pulsed noise having a large amplitude is superimposed on the reception signal b at timing T3a, the absolute value of the integrated value of the reception signal b integrated by the integration unit 12 is sufficiently larger than the absolute value (in the mirror integration circuit of FIG. 3, the GND voltage) of the determination threshold Vth, so that the determination unit 15 can normally perform 01 determination and no bit error occurs.

Figure 7:
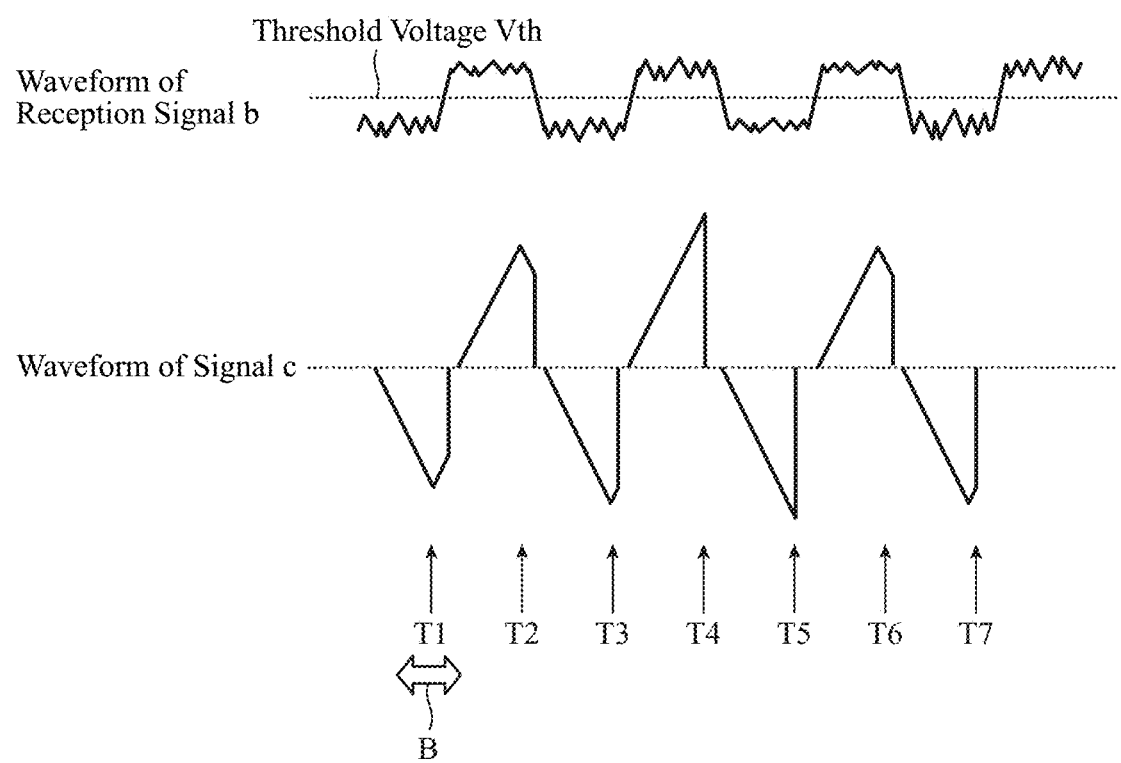
FIG. 7 is an explanatory diagram illustrating that there is no influence on the determination result even if the timing of 01 determination deviates in the waveform of the signal obtained by integrating the reception signal.

FIG. 7 is an explanatory diagram illustrating that, in the waveform of the signal c obtained by integrating the reception signal b, the determination result is not affected even if the timing of 01 determination is shifted. The above-described "certain determined timing" is a timing based on a clock signal input from the outside or a timing determined from the waveform of the reception signal. For example, the timing determined from the waveform of the reception signal is the timing at which the 01 determination is performed at the center position of the two zero-cross points in the eye pattern of the reception signal, that is, the eye opening at which the amplitude of the reception signal is the largest. As described above, in the conventional reception circuit, the timing of 01 determination is often managed in detail.

On the other hand, in the reception circuit 1 according to the first embodiment, the signal c obtained by integrating the reception signal b is a target of 01 determination. Since the voltage of the reception signal b is accumulated by the integration time and the integrated value unilaterally increases, fine management of the determination timing as in the related art is unnecessary. For example, in a case where the 01 determination is performed at the timings T1 to T7 illustrated in FIG. 7, the timing T1 is not a timing at which the integrated value of the reception signal b is the maximum, but since the absolute value of the integrated value is sufficiently larger than the absolute value of the determination threshold Vth, the 01 determination can be performed normally, and a bit error does not occur.

In the conventional reception circuit, a bit error occurs when 01 determination is performed while the voltage of the reception signal transitions to high or low in a case where the jitter amount is large or in a pattern in which 0 and 1 appear in the reception signal. On the other hand, as long as the integrated value of the reception signal b for one-bit time is not reset until the determination is performed after the peak point of the integrated waveform of the reception signal b is detected by the detection unit 13, the determination unit 15 can normally perform the determination even if a slight time lag occurs as indicated by an arrow B in FIG. 7. As described above, in the reception circuit 1, strict management of the timing of 01 determination is unnecessary.

Figure 8:
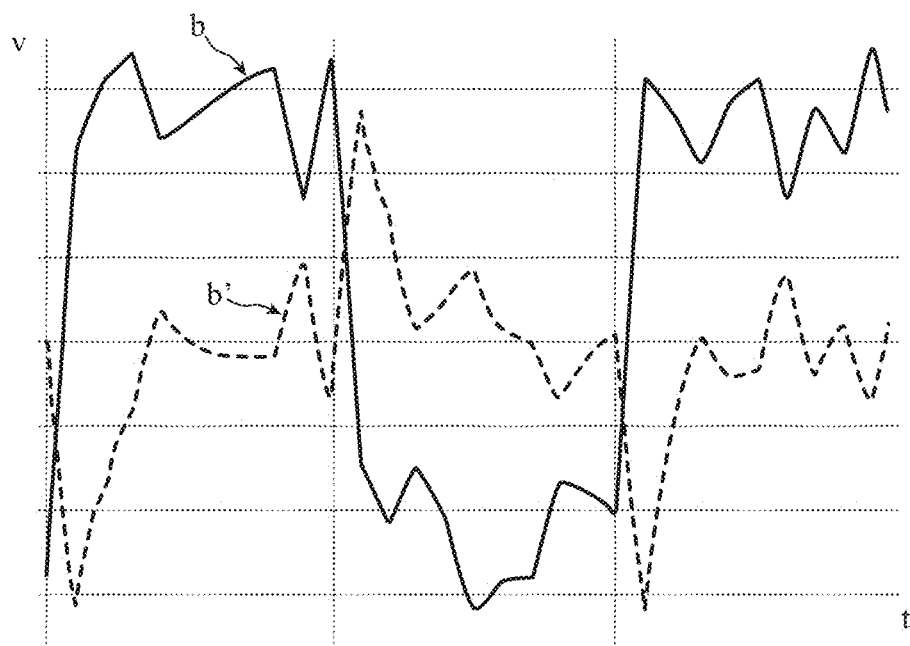
FIG. 8 is a diagram illustrating a relationship between a waveform of a reception signal and a waveform of a signal obtained by first-order differentiating the reception signal

FIG. 8 is a diagram illustrating a relationship between a waveform of a reception signal b and a waveform of a signal b' obtained by first-order differentiating the reception signal b. In FIG. 8, since the noise varying in a shorter time than the bit signal period is superimposed on the reception signal b, the amplitude of the reception signal b changes slightly in an extremely short time, and the change amount of the waveform of the signal b' obtained by first-order differentiating the reception signal b increases. Detecting the edge at the time of rising from low to high and the edge at the time of falling from high to low in the waveform of the reception signal b corresponds to obtaining the gradient component of the differential waveform in which the voltage value greatly changes upward and downward as illustrated in FIG. 8, and is very difficult processing.

On the other hand, the reception circuit 1 according to the first embodiment invalidates or flattens the noise superimposed on the reception signal b by integrating the reception signal b, and then second-order differentiates the integrated waveform to detect the peak point of the integrated waveform. As a result, it is possible to easily detect an edge when the waveform of the reception signal b rises from low to high and an edge when the waveform falls from high to low.

Hitherto, the method of using the second-order differentiated integrated waveform in order to detect the peak point of the integrated waveform has been described, but it is not limited thereto. In the reception circuit 1 according to the first embodiment, other methods may be used as long as the method can detect the peak point of the integrated waveform.

As described above, in the reception circuit 1 according to the first embodiment, the timing of resetting the integrated value of the reception signal b and the timing of determining whether the voltage of the reception signal b for each one-bit time is high or low are indicated on the basis of the peak point of the integrated waveform of the reception signal b. As a result, the timing for performing 01 determination and the timing for resetting the integrated value can be obtained from the reception signal b without using the plurality of clock signals, so that a plurality of reception circuits and a plurality of signal lines are unnecessary, and the circuit scale can be reduced.

Second Embodiment

In the first embodiment, in order to detect the peak point of the integrated waveform of the reception signal b, the case where the integrated waveform of the reception signal b is second-order differentiated has been described. However, a reception circuit according to a second embodiment uses a waveform of a signal obtained by differentiating the integrated waveform of the reception signal b three or more times.

Figure 9:
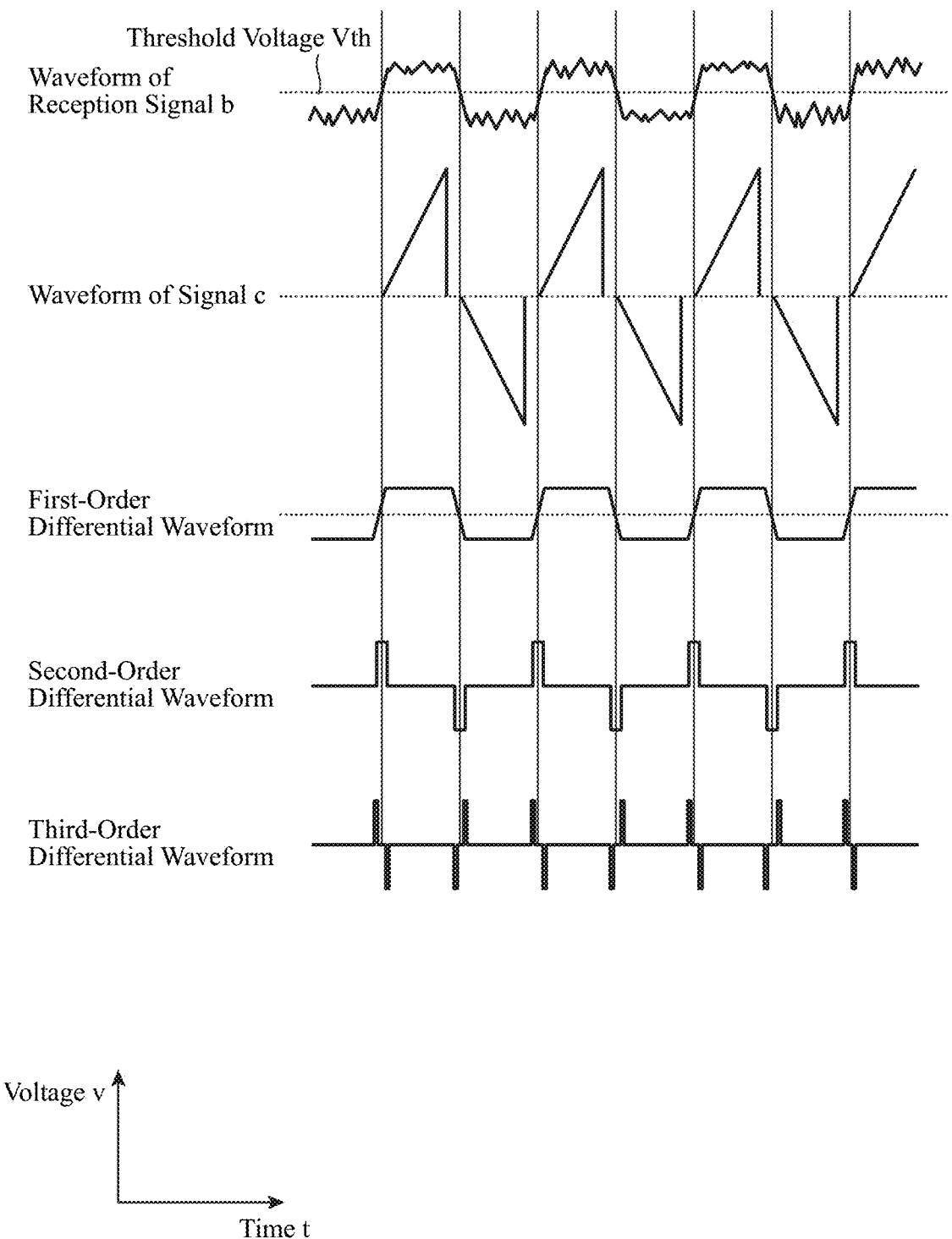
FIG. 9 is a waveform diagram illustrating a waveform of a signal used by a reception circuit according to a second embodiment.

FIG. 9 is a waveform diagram illustrating waveforms of signals used by the reception circuit according to the second embodiment, and illustrates a waveform of a reception signal b, a waveform of a signal c, a waveform of a signal obtained by first-order differentiating the signal c, a waveform of a signal obtained by second-order differentiating the signal c, and a waveform of a signal obtained by third-order differentiating the signal c. In FIG. 9, the horizontal axis represents time t, and the vertical axis represents voltage v. Note that, hereinafter, a case where the waveform of the signal obtained by third-order differentiating the signal c corresponds to only the timings of rising and falling of the pulse in the waveform of the signal obtained by second-order differentiating the signal c will be described.

The detection unit 13 that third-order differentiates the signal c can be implemented by, for example, a circuit in which three differentiating circuits illustrated in FIG. 5 are connected in series. On the other hand, in the mirror integration circuit illustrated in FIG. 3, since the reception signal b is input to the inverting input terminal of the operational amplifier OP, the relationship between high and low of the voltage is reversed (reversed-phase) between the waveform of the reception signal b and the output integrated waveform. When the signal c integrated by the mirror integration circuit is first-order differentiated by the differentiating circuit illustrated in FIG. 5, the relationship between high and low of the voltage is reversed between the waveform of the first-order differentiated signal and the waveform of the signal c. That is, the relationship between high and low of the voltage is the same (in-phase) between the waveform of the first-order differentiated signal and the waveform of the reception signal b.

In a case where the signal c is second-order differentiated by the detection unit 13, the relationship between high and low of the voltage is reversed-phase between the waveform of the second-order differentiated signal and the waveform of the reception signal b, but when the signal c is third-order differentiated, the relationship between high and low of the voltage is in-phase between the waveform of the third-order differentiated signal and the waveform of the reception signal b. In the waveform in which the signal c is three-order differentiated by the detection unit 13, it is possible to easily identify whether it is a change from high to low or a change from low to high of the voltage in the waveform of the reception signal b.

Note that the detection unit 13 may detect the peak point of the integrated waveform of the reception signal b on the basis of both the waveform of the signal obtained by second-order differentiating the signal c and the waveform of the signal obtained by third-order differentiating the signal c.

As described above, in the reception circuit according to the second embodiment, the detection unit 13 detects the peak point of the integrated waveform of the reception signal b on the basis of the waveform obtained by differentiating the integrated waveform of the reception signal b a plurality of times. As a result, the timing for performing 01 determination and the timing for resetting the integrated value are obtained from the reception signal b without using the plurality of clock signals.

Third Embodiment

A reception circuit according to a third embodiment uses a reception signal having a pattern in which high and low voltages are randomly generated, instead of a signal in which high and low voltages are alternately repeated like a clock signal.

Figure 10:
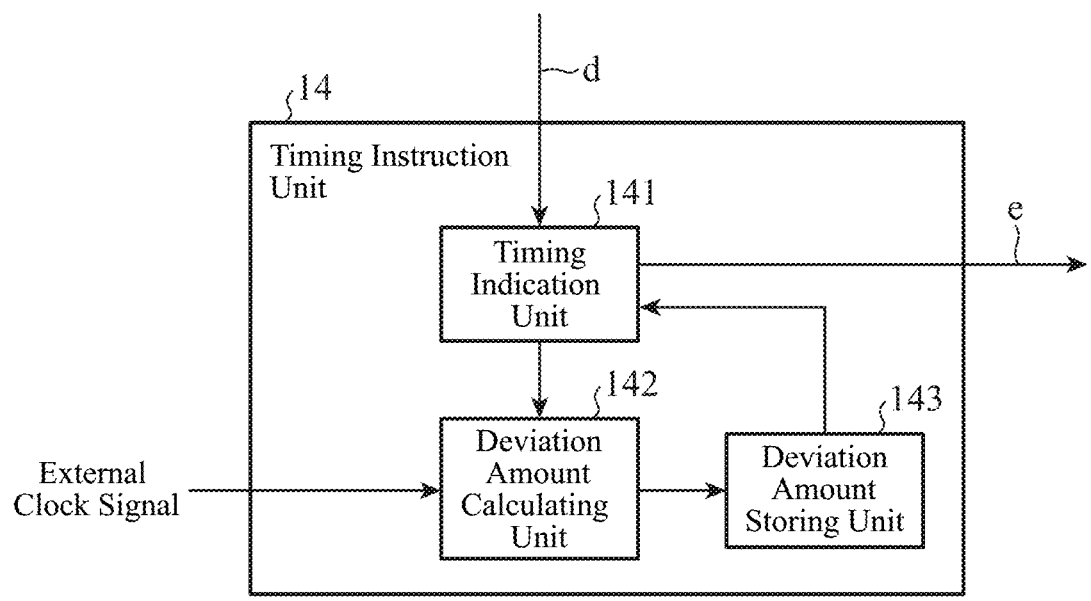
FIG. 10 is a block diagram illustrating a configuration of a timing indication unit according to a third embodiment.

FIG. 10 is a block diagram illustrating a configuration of a timing indication unit 14 according to the third embodiment. As illustrated in FIG. 10, the timing indication unit 14 includes a timing determination unit 141, a deviation amount calculating unit 142, and a deviation amount storing unit 143. On the basis of a deviation amount stored in the deviation amount storing unit 143, the timing determination unit 141 determines a timing at which the integrated value of the reception signal b integrated for one-bit time by the integration unit 12 is reset and a timing at which determination is performed by the determination unit 15.

The deviation amount calculating unit 142 is a calculation unit for calculating a deviation amount between a timing at which the peak point is detected from the integrated waveform of the reception signal b by the detection unit 13 and a change timing of rising and falling of an external clock signal. The deviation amount storing unit 143 is a storage unit that stores the deviation amount calculated by the deviation amount calculating unit 142.

For example, when the transmission signal a output from the transmission device 3 has a bit pattern in which the same bit value continues such as "111 . . . ", a peak point does not appear in the integrated waveform of the reception signal b with respect to the transmission signal a that has been received. When three consecutive bit values "I" are present in the reception signal b, the integration unit 12 accumulates the reception signal b for three bits, and the detection unit 13 cannot detect the peak point from the integrated waveform during the three bits.

In the reception circuit according to the third embodiment, the deviation amount calculating unit 142 calculates the deviation amount between the timing at which the waveform of the external clock signal changes and the timing at which the peak point is detected from the integrated waveform of the reception signal b by the detection unit 13, and stores the calculated deviation amount in the deviation amount storing unit 143. In a case where the signal d indicating the peak point in the next one-bit time is not input from the detection unit 13 even when the 1-bit time is exceeded, the timing determination unit 141 determines the timing of resetting the integrated value of the reception signal b and the timing of determination on the basis of the deviation amount stored in the deviation amount storing unit 143. The indication information e indicating the timing determined by the timing determination unit 141 is output to the integration unit 12 and the determination unit 15.

As described above, in the reception circuit according to the third embodiment, the timing indication unit 14 indicates the timing at which the integration unit 12 resets the integrated value of the reception signal b for each one-bit time and the timing at which the determination unit 15 performs the determination on the basis of the deviation amount stored in the deviation amount storing unit 143. As a result, even if the reception signal b has a bit pattern in which the same bit value continues, it is possible to reset the integrated value and perform determination every one-bit time.

It should be noted that the present invention is not limited to the above-described embodiments, and within the scope of the present invention, free combination of each of the embodiments, modification of any constituent element of each of the embodiments, or omission of any constituent element of each of the embodiments can be made.

INDUSTRIAL APPLICABILITY

The reception circuit according to the present invention can be used in a communication device of a digital signal.

REFERENCE SIGNS LIST

1: reception circuit, 2: transmission path, 3: transmission device, 11: buffer, 12: integration unit, 12a: switch, 13: detection unit, 14: timing indication unit, 15: determination unit, 16: display unit, 141: timing determination unit, 142: deviation amount calculating unit, 143: deviation amount storing unit

The invention claimed is:

1. A reception circuit comprising:
processing circuitry configured to
integrate a reception signal for each integration time;
detect a peak point of an integrated waveform of the reception signal;
determine whether a voltage of the reception signal for each integration time is high or low on a basis of the integrated waveform of the reception signal for each integration time; and
indicate a resetting timing of an integrated value and a determination timing on a basis of the peak point detected from the integrated waveform of the reception signal, wherein
the processing circuitry resets the integrated value of the reception signal for each integration time at the indicated resetting timing, and
the processing circuitry performs determination at the indicated determination timing and sequentially outputs a voltage value of the reception signal for each integration time.

2. The reception circuit according to claim 1, wherein the processing circuitry detects the peak point of the integrated waveform of the reception signal on a basis of a waveform of a signal obtained by differentiating the integrated waveform of the reception signal a plurality of times.

3. The reception circuit according to claim 1, wherein the processing circuitry is further configured to calculate a deviation amount between a timing at which a peak point is detected from the integrated waveform of the reception signal and a change timing at which a clock signal input from outside rises or falls; and
store the calculated deviation amount, wherein
the processing circuitry indicates the resetting timing of the integrated value and the determination timing on a basis of the stored deviation amount.

* * * * *